US009859316B2

(12) United States Patent
Tomyo

(10) Patent No.: US 9,859,316 B2
(45) Date of Patent: Jan. 2, 2018

(54) SEMICONDUCTOR DEVICE AND METHOD FOR MANUFACTURING SAME

(71) Applicant: Sharp Kabushiki Kaisha, Sakai, Osaka (JP)

(72) Inventor: Atsushi Tomyo, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/316,225

(22) PCT Filed: Jun. 1, 2015

(86) PCT No.: PCT/JP2015/065757
§ 371 (c)(1),
(2) Date: Dec. 5, 2016

(87) PCT Pub. No.: WO2015/186657
PCT Pub. Date: Dec. 10, 2015

(65) Prior Publication Data
US 2017/0148834 A1 May 25, 2017

(30) Foreign Application Priority Data
Jun. 6, 2014 (JP) .................................. 2014-117885

(51) Int. Cl.
*H01L 29/10* (2006.01)
*H01L 27/146* (2006.01)
(Continued)

(52) U.S. Cl.
CPC .. *H01L 27/14616* (2013.01); *H01L 27/14625* (2013.01); *H01L 27/14636* (2013.01);
(Continued)

(58) Field of Classification Search
CPC ......... H01L 27/14616; H01L 27/14636; H01L 27/14625; H01L 27/14692; H01L 27/14649; H04N 5/32
See application file for complete search history.

(56) References Cited

U.S. PATENT DOCUMENTS 6,242,746 B1 * 6/2001 Teranuma ......... H01L 27/14676
250/370.08
6,262,408 B1 * 7/2001 Izumi ................ H01L 27/14676
250/208.1
(Continued)

FOREIGN PATENT DOCUMENTS

JP 2000-208749 A 7/2000
JP 2004-087604 A 3/2004
(Continued)

OTHER PUBLICATIONS

Official Communication issued in International Patent Application No. PCT/JP2015/065757, dated Jul. 14, 2015.

*Primary Examiner* — Trung Q Dang
(74) *Attorney, Agent, or Firm* — Keating & Bennett, LLP

(57) ABSTRACT

The present invention has an object of improving the operation stability of a semiconductor device that detects radiations without decreasing the yield thereof. A semiconductor device includes an active matrix substrate (50) including a plurality of TFTs (10) and a plurality of pixel electrode (20); a photoelectric conversion substrate (62) located to face the active matrix substrate (50); an upper electrode (64) provided on a surface of the photoelectric conversion substrate (62) opposite to the active matrix substrate (50); and a plurality of connection electrodes (72) provided between the active matrix substrate (50) and the photoelectric conversion substrate(62), the plurality of connection electrodes (72) being formed of metal material. Each of the plurality of connection electrodes (72) is in direct contact with any of the plurality of pixel electrodes (20) and with the photoelectric conversion substrate (62), overlaps a semiconductor layer (14) of any of the plurality of TFTs (10) as seen in a direction normal to the active matrix substrate (50), and contains a metal element having an atomic number of 42 or greater and 82 or smaller.

12 Claims, 9 Drawing Sheets

(51) Int. Cl.
  *H04N 5/374*  (2011.01)
  *H04N 5/32*  (2006.01)
(52) U.S. Cl.
  CPC .. *H01L 27/14649* (2013.01); *H01L 27/14689* (2013.01); *H01L 27/14692* (2013.01); *H04N 5/32* (2013.01); *H04N 5/374* (2013.01)

(56) References Cited

U.S. PATENT DOCUMENTS

| | | | |
|---|---|---|---|
| 2003/0010922 | A1 | 1/2003 | Yoon et al. |
| 2012/0049077 | A1* | 3/2012 | Okada ............... H01L 27/14603 250/370.08 |
| 2012/0138922 | A1 | 6/2012 | Yamazaki et al. |
| 2013/0032724 | A1 | 2/2013 | Totsuka |
| 2015/0346358 | A1* | 12/2015 | Arimoto .................. G01T 1/20 250/361 R |
| 2016/0116607 | A1* | 4/2016 | Horiuchi .............. C09K 11/628 250/361 R |

FOREIGN PATENT DOCUMENTS

| | | |
|---|---|---|
| JP | 2005-167260 A | 6/2005 |
| JP | 2009-212120 A | 9/2009 |
| JP | 2010-096616 A | 4/2010 |
| JP | 2012-134475 A | 7/2012 |
| JP | 2012-211866 A | 11/2012 |
| JP | 2013-036814 A | 2/2013 |
| WO | 2013/080105 A2 | 6/2013 |

* cited by examiner (a)

(b)

(c)

(a)

(b)

SEMICONDUCTOR DEVICE AND METHOD FOR MANUFACTURING SAME

TECHNICAL FIELD

The present invention relates to a semiconductor device and a method for producing the same; for example, a semiconductor device detecting radiations or converting the radiations into electric charges, and a method for producing the same.

BACKGROUND ART

A flat panel-type radiation detection device is increasingly used in, for example, a medical field. For example, a radiation detection device including an active matrix substrate including a thin film transistor (hereinafter, referred to as a "TFT") in each of pixels and a photoelectric conversion layer provided on the active matrix substrate is used as, for example, a contact image sensor or an x-ray detector. Radiations (e.g., x-rays) incident on the photoelectric conversion layer are converted into electric charges as a function of the radiation dose thereof, and read as an electric signal by a TFT acting as a switching element. A system of directly converting information on radiations into an electric signal by a photoelectric conversion layer is called a "direct conversion system". A radiation detection device may detect the radiations by an indirect conversion system instead of the direct conversion system. With the indirect conversion system, the radiations are converted into light by a wavelength conversion layer such as a scintillator or the like, and then converted into electric charges by a photoelectric conversion layer.

Patent Document 1 provided by the present applicant discloses a two-dimensional radiation image detector including an active matrix substrate and a counter substrate that are connected with each other by a connection layer containing a resin.

Patent Document 2 discloses a radiation detection device including a metal layer that attenuates backscattered radiations in order to suppress a situation where noise is included in an electric signal by the incidence of the backscattered radiations on a photoelectric conversion layer.

CITATION LIST

Patent Literature

Patent Document 1: Japanese Laid-Open Patent Publication No. 2005-167260
Patent Document 2: Japanese Laid-Open Patent Publication No. 2012-211866

SUMMARY OF INVENTION

Technical Problem

The studies made by the present inventor have found that the two-dimensional radiation image detector disclosed in Patent Document 1 and the radiation detection device disclosed in Patent Document 2 are occasionally insufficient in the operation stability. Specifically, the conversion from the radiation dose of the radiations into an electric signal occasionally depends on the radiation dose. The "operation stability" of a semiconductor device that detects radiations refers how uniformly the radiation dose of the radiations is converted into an electric signal.

The present invention has an object of improving the operation stability of a semiconductor device that detects radiations without decreasing the yield thereof.

Solution to Problem

A semiconductor device in an embodiment according to the present invention includes an active matrix substrate including a plurality of TFTs and a plurality of pixel electrodes; a photoelectric conversion substrate located to face the active matrix substrate; an upper electrode provided on a surface of the photoelectric conversion substrate opposite to the active matrix substrate; and a plurality of connection electrodes provided between the active matrix substrate and the photoelectric conversion substrate, the plurality of connection electrodes being formed of metal material. Each of the plurality of connection electrodes is in direct contact with any of the plurality of pixel electrodes and with the photoelectric conversion substrate, overlaps a semiconductor layer of any of the plurality of TFTs as seen in a direction normal to the active matrix substrate, and contains a metal element having an atomic number of 42 or greater and 82 or smaller.

In an embodiment, the plurality of connection electrodes each have a thickness of 10 µm or greater and 100 µm or less.

A semiconductor device in another embodiment according to the present invention includes an active matrix substrate including a plurality of TFTs and a plurality of pixel electrodes; a photoelectric conversion substrate located to face the active matrix substrate; an upper electrode provided on a surface of the photoelectric conversion substrate opposite to the active matrix substrate; a plurality of connection electrodes and a plurality of radiation absorption films provided on a surface of the photoelectric conversion substrate that faces the active matrix substrate; and at least one connection resin layer provided between the plurality of pixel electrodes and the plurality of connection electrodes, the at least one connection resin layer including a plurality of connection resin portions each electrically connecting any of the plurality of pixel electrodes and any of the plurality of connection electrodes to each other. Each of the plurality of radiation absorption films is insulating, overlaps a semiconductor layer of any of the plurality of TFTs as seen in a direction normal to the active matrix substrate, and contains an element having an atomic number of 42 or greater and 82 or smaller.

In an embodiment, the plurality of radiation absorption films are each in direct contact with any of the plurality of connection electrodes.

In an embodiment, the surface of the photoelectric conversion substrate that faces the active matrix substrate is covered with the plurality of connection electrodes and the plurality of radiation absorption films.

In an embodiment, the plurality of radiation absorption films each have a thickness of 10 µm or greater and 100 µm or less.

In an embodiment, the photoelectric conversion substrate converts radiations into electric charges.

In an embodiment, the semiconductor device further includes a wavelength conversion layer converting radiations into at least one of infrared rays, visible light rays and ultraviolet rays, and the photoelectric conversion substrate converts the at least one of the infrared rays, the visible light rays and the ultraviolet rays into electric charges.

In an embodiment, the semiconductor layer contains an oxide semiconductor.

In an embodiment, the oxide semiconductor includes an In—Ga—Zn—O-based semiconductor.

In an embodiment, the In—Ga—Zn—O-based semiconductor includes a crystalline portion.

A method for producing a semiconductor device in an embodiment according to the present invention includes step (a) of preparing an active matrix substrate including a plurality of TFTs and a plurality of pixel electrodes and providing a plurality of connection electrodes formed of metal material on the plurality of pixel electrodes, the plurality of connection electrodes each being in direct contact with any of the plurality of pixel electrodes, overlapping a semiconductor layer of any of the plurality of TFTs as seen in a direction normal to the active matrix substrate, and containing a metal element having an atomic number of 42 or greater and 82 or smaller; step (b) of preparing a photoelectric conversion substrate and providing an upper electrode on one surface of the photoelectric conversion substrate; and step (c) of securing the plurality of connection electrodes as being in direct contact with the photoelectric conversion substrate after the steps (a) and (b).

Advantageous Effects of Invention

An embodiment of the present invention improves the operation stability of a semiconductor device that detects radiations without decreasing the yield thereof.

DESCRIPTION OF EMBODIMENTS

First, a reason, found by the present inventor, why the two-dimensional radiation image detector disclosed in Patent Document 1 and the radiation detection device disclosed in Patent Document 2 are occasionally insufficient in the operation stability will be described.

The studies made by the present inventor have found that in the two-dimensional radiation image detector disclosed in Patent Document 1 and the radiation detection device disclosed in Patent Document 2, the conversion from the radiation dose of the radiations into an electric signal is not performed uniformly and occasionally depends on the radiation dose.

Figure 9:
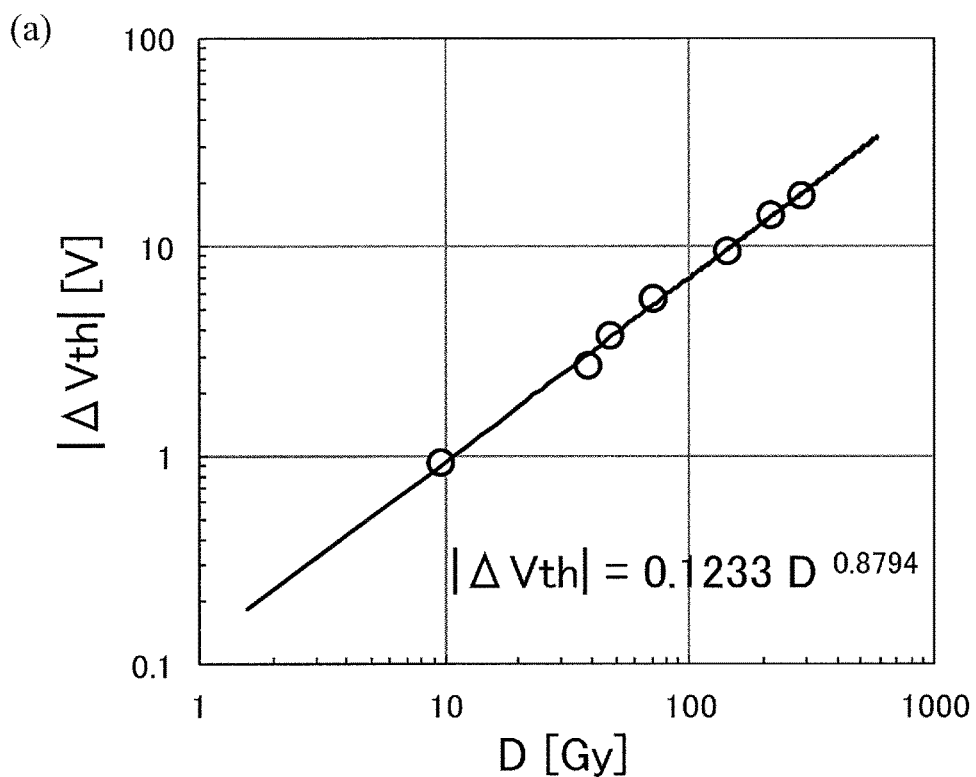
FIG. 9(a) and FIG. 9(b) show how the threshold voltage of a TFT is changed by the TFT being irradiated with x-rays.
Figure 9:
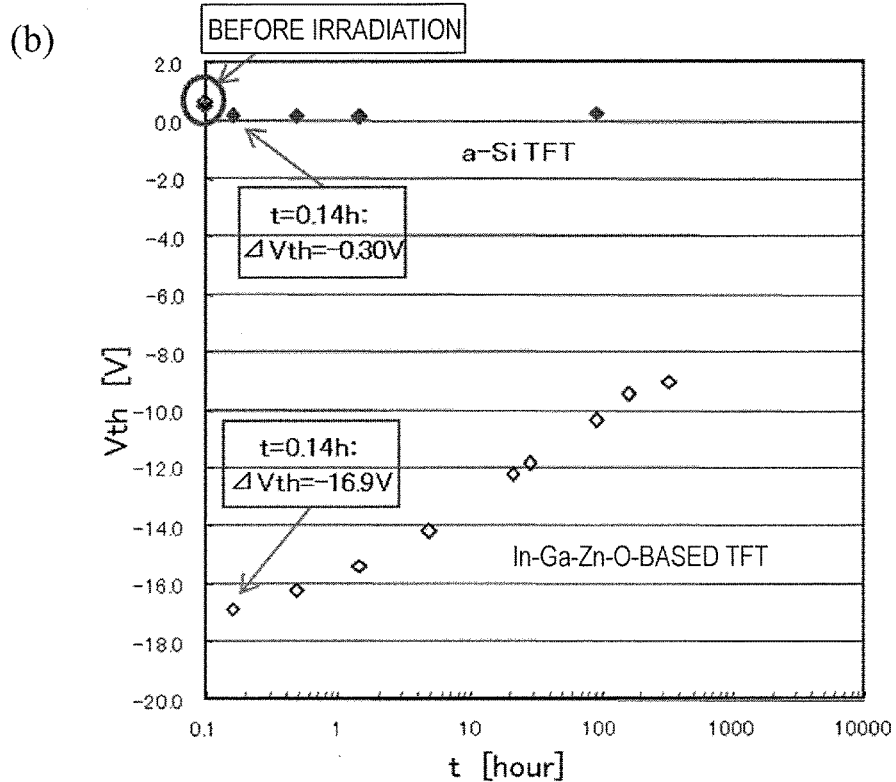

In order to find why the two-dimensional radiation image detector disclosed in Patent Document 1 and the radiation detection device disclosed in Patent Document 2 are occasionally insufficient in the operation stability, the present inventor examined the change in the characteristic of the TFT caused by the TFT being irradiated with x-rays. Especially, the present inventor examined the influence on the threshold voltage (Vth) of the TFT exerted by the x-rays directed toward the TFT. The results of the examination will be described with reference to FIG. 9.

FIG. 9(a) is a graph showing the absolute value of a shift in the threshold voltage of the TFT, namely, $|\Delta Vth|$ (V), with respect to the absorbed dose of the x-rays directed toward the TFT, namely, D (Gy). In the graph of FIG. 9(a), the horizontal axis represents the absorbed dose D (Gy) of the x-rays by the logarithm scale, and the vertical axis represents the absolute value $|\Delta Vth|$ (V) of the shift in the threshold voltage by the logarithm scale.

A TFT using $InGaZnO_4$ as a material of a semiconductor layer (active layer) thereof was prepared, and the radiation dose D of the x-rays directed toward the TFT was changed to measure the shift $\Delta Vth$ in the threshold voltage of the TFT corresponding to each level of the dose. The radiation dose of the x-rays is represented as the absorbed dose (energy given to a unit mass of a substance as a result of interaction of the radiations and the substance). In the graph of FIG. 9(a), the white circles represent the measurement results. The solid line in the graph shows $|\Delta Vth|=0.1233\ D^{0.8794}$, which is the relational expression that is obtained by the least squares method from the measurement results (white circles) and represents the relationship between the absorbed dose D and the absolute value $|\Delta Vth|$ of the shift in the threshold voltage. It is seen that as the radiation dose of the x-rays directed toward the TFT increases, the shift in the threshold voltage of the TFT increases, and thus the change in the characteristic of the TFT increases.

FIG. 9(b) is a graph showing the threshold voltage Vth (V) of the TFT with respect to the time duration t (hour) after the x-rays were directed toward the TFT. In the graph of FIG. 9(b), the horizontal axis represents the time duration t (h) by the logarithm scale, and the vertical axis represents the threshold voltage Vth (V).

Two types of TFTs respectively using amorphous silicon (a-Si) and $InGaZnO_4$ as materials of semiconductor layers thereof were prepared. The TFTs were each irradiated with x-rays corresponding to an absorbed dose of 284 Gy (irradiated with x-rays generated at an x-ray tube voltage of 80 kV and an x-ray tube current of 80 μA for 120 minutes). The change in the threshold voltage Vth (V) with respect to the time duration t (h) after the irradiation was measured. For the measurement, Microfocus X-ray Inspection System ME41001V (maximum x-ray tube voltage: 100 kV) produced by Pony Industry Co., Ltd. was used. The source-drain voltage Vsd of the TFT was 5 V. In the graph of FIG. 9(b), the black rhombuses represent the results on the TFT using amorphous silicon (a-Si) as the material of the semiconductor layer thereof (a-Si TFT), and the white rhombuses represent the results on the TFT using $InGaZnO_4$ as the material of the semiconductor layer thereof (In—Ga—Zn—O-based TFT). For a comparison, a value of the threshold voltage Vth before the irradiation with the x-rays is plotted on the vertical axis.

As shown in FIG. 9(b), as a result of the irradiation with the x-rays, the threshold voltage Vth of each TFT is shifted to the negative side (is decreased). Especially, the threshold voltage of the In—Ga—Zn—O-based TFT has a negative value after the irradiation with the x-rays. It is seen that the absolute value of the shift in the threshold voltage of the In—Ga—Zn—O-based TFT is larger than that of the a-Si TFT. For example, as compared with the threshold voltage before the irradiation with the x-rays, the shift (difference) ΔVth in the threshold voltage Vth at a time duration t=0.14 h after the irradiation with the x-rays is −0.30 V in the a-Si TFT and is −16.9 V in the In—Ga—Zn—O-based TFT. In this case, the absolute value of the shift in the In—Ga—Zn—O-based TFT is more than 50 times the absolute value of the shift in the a-Si TFT. The shift in the threshold voltage by the irradiation with the x-rays tends to decrease as the time duration t after the irradiation with the x-rays extends both in the In—Ga—Zn—O-based TFT and the a-Si TFT. It has been found that the In—Ga—Zn—O-based TFT has a larger absolute value of the shift than that in the a-Si TFT, and therefore, tends to have the shift in the threshold voltage remaining for a long time after the irradiation with the x-rays.

In general, the threshold voltage of the TFT is shifted because electric charges are accumulated at, for example, an interface between the semiconductor layer and an insulating layer in contact therewith (e.g., gate insulating film or passivation film). In, for example, an n-type semiconductor having electrons as carriers, when positive charges are accumulated at such an interface, the threshold voltage is shifted to the negative side. Trapping of the electric charges at a level made by a defect caused to the semiconductor layer or the insulating layer may also be a factor that shifts the threshold voltage. Therefore, in the case where the TFT is irradiated with the x-rays, it is considered that optical excitation of the carriers and/or generation of a defect level causes the threshold voltage to be shifted as shown in FIG. 9(a) and FIG. 9(b). In general, oxygen deficiency tends to be easily caused in an oxide semiconductor, and oxygen deficiency may form a donor level. It is considered that for this reason, the shift in the threshold voltage is larger in the In—Ga—Zn—O-based TFT than that in the a-Si TFT as shown in FIG. 9(b).

As a result of making studies based on the measurement results shown in FIG. 9(a) and FIG. 9(b), the present inventor has found that the reason why the operation stability is not sufficient in the two-dimensional radiation image detector disclosed in Patent Document 1 is that the radiations transmitted through the photoelectric conversion layer are incident on the semiconductor layer of the TFT. It has been found that the incidence of the radiations transmitted through the photoelectric conversion layer on the semiconductor layer of the TFT fluctuates the characteristic of the TFT (e.g., shifts the threshold voltage), which contributes to the insufficient operation stability.

In the radiation detection device disclosed in Patent Document 2, the radiations transmitted through the photoelectric conversion layer and backscattered are suppressed from being incident on the TFT. It has been found that despite the suppression, the operation stability of the radiation detection device disclosed in Patent Document 2 is occasionally insufficient. The present inventor has found that the direct incidence of the radiations transmitted through the photoelectric conversion layer on the semiconductor layer of the TFT contributes to the insufficient operation stability of the radiation detection device.

The studies made by the present inventor have found that the problem of the insufficient operation stability tends to be remarkable especially in a radiation detection device using an oxide semiconductor as a material of the semiconductor layer of the TFT. The oxide semiconductor includes an In—Ga—Zn—O-based semiconductor containing, for example, indium, gallium, zinc and oxygen as main components.

The above-described explanation is conceived by the present inventor, and does not limit the present invention in any way.

Hereinafter, semiconductor devices in embodiments according to the present invention will be described with reference to the drawings. Each of the semiconductor devices in the embodiments is, for example, of a flat panel type, and is, for example, a radiation detection device (e.g., x-ray flat panel detector, x-ray imaging device, x-ray imaging and display device). The "radiations" widely encompasses electromagnetic waves and light. The "electromagnetic waves and light" encompasses, for example, γ rays, x-rays, ultraviolet rays, visible light rays, infrared rays, and the like. The present invention is not limited to any of the following embodiments. In the drawings referred to below, components having substantially the same functions are represented by the same reference signs, and the descriptions thereof may be omitted.

Figure 1:
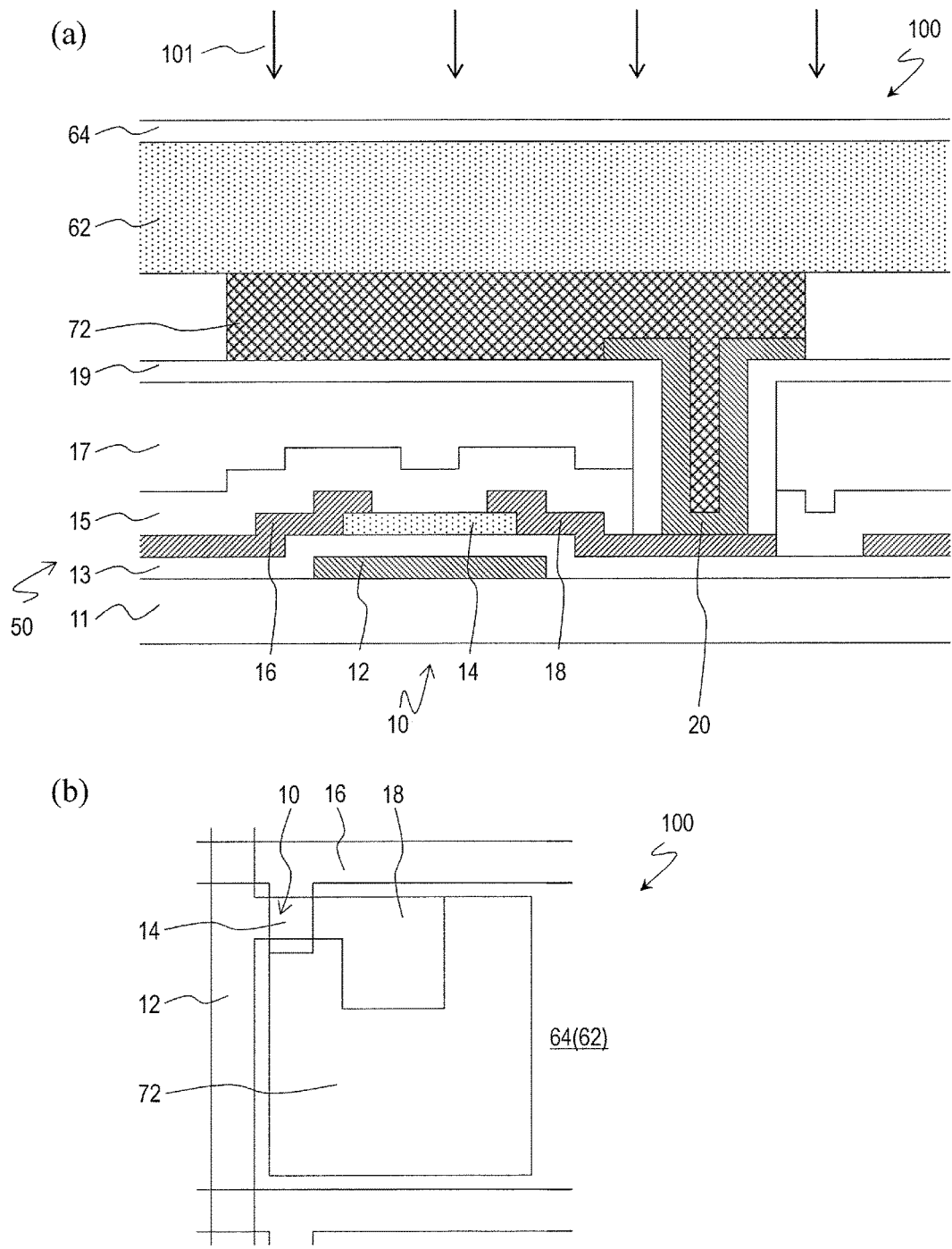
FIG. 1(a) is a schematic cross-sectional view of a semiconductor device 100 in an embodiment according to the present invention.
FIG. 1(b) is a schematic plan view of the semiconductor device 100.

FIG. 1 shows a schematic cross-sectional view and a schematic plan view of a semiconductor device 100 in an embodiment according to the present invention. FIG. 1(a) is a schematic cross-sectional view of the semiconductor device 100, and FIG. 1(b) is a schematic plan view of the semiconductor device 100.

As shown in FIG. 1(a), the semiconductor device 100 includes an active matrix substrate 50, a photoelectric conversion substrate 62 located to face the active matrix substrate 50, an upper electrode 64 provided on a surface of the photoelectric conversion substrate 62 opposite to the active matrix substrate 50, and a plurality of connection electrodes 72 provided between the active matrix substrate 50 and the photoelectric conversion substrate 62 and formed of metal material. The "metal material" encompasses alloys and intermetallic compounds. The active matrix substrate 50 includes a plurality of TFTs 10 and a plurality of pixel electrodes 20. The connection electrode 72 is in direct contact with the pixel electrode 20 and with the photoelectric conversion substrate 62. The connection electrode 72 overlaps a semiconductor layer 14 included in the TFT 10 as seen in a direction normal to the active matrix substrate 50. The connection electrode 72 contains a metal element having an atomic number of 42 or greater and 82 or smaller. The connection electrode 72 may contain a single metal element having an atomic number of 42 or greater and 82 or smaller, or may contain a conductive compound (e.g., oxide or nitride) of such metal elements.

The connection electrode 72 contains a metal element having an atomic number of 42 or greater and 82 or smaller, and therefore, attenuates radiations transmitted through the photoelectric conversion substrate 62 among radiations 101 incident on the semiconductor device 100 from the side of the photoelectric conversion substrate 62. The connection electrode 72 overlaps the semiconductor layer 14 of the TFT 10 as seen in the direction normal to the active matrix substrate 50, and therefore, suppresses the radiations transmitted through the photoelectric conversion substrate 62, among the radiations 101 incident on the semiconductor device 100 from the side of the photoelectric conversion substrate 62, from being directly incident on the semiconductor layer 14. Since the radiations transmitted through the photoelectric conversion substrate 62 are suppressed from being directly incident on the semiconductor layer 14, the semiconductor device 100 has a high level of operation stability. The effect that the connection electrode 72 attenuates the radiations by containing a metal element having an atomic number of 42 or greater and 82 or smaller will be described with reference to FIG. 3.

The connection electrode 72 is in direct contact with the pixel electrode 20 and also with the photoelectric conversion substrate 62. Therefore, the semiconductor device 100 does not need to include a connection resin layer that connects the active matrix substrate 50 and the photoelectric conversion substrate 62 to each other. The semiconductor device 100 does not need to include another layer or film in order to improve the operation stability thereof. The semiconductor device 100 realizes a high level of operation stability without decreasing the yield thereof.

The TFT 10 of the semiconductor device 100 further includes a gate electrode 12, a gate insulating film 13, a source electrode 16 and a drain electrode 18, which are supported by a substrate 11. The semiconductor device 100 further includes, for example, a first interlayer insulating film 15, an interlayer flatting film 17, and a second interlayer insulating film 19, which cover the TFT 10. The TFT 10 may further include an insulating film (not shown) in contact with at least a top surface of a portion of the semiconductor layer 14 that acts as a channel region. This insulating film may act as an etch stop film in a step of forming the source electrode 16 and the drain electrode 18. The TFT 10 of the semiconductor device 100 is of a bottom gate type. The semiconductor device in an embodiment according to the present invention is not limited to having such a TFT. The TFT of the semiconductor device in an embodiment according to the present invention may be of a top gate type.

As shown in FIG. 1(b), the TFT 10 is connected with a corresponding gate line 12 and a corresponding source line 16. For the sake of simplicity, the gate line 12 and the source line 16 are represented by the same reference signs as those of the gate electrode 12 and the source electrode 16. The semiconductor device 100 includes a plurality of the TFTs 10 arrayed in, for example, a matrix. The connection electrode 72 is provided in, for example, correspondence with each of the TFTs 10. The photoelectric conversion substrate 62 and the upper electrode 64 are provided over, for example, the entirety of a top surface of the active matrix substrate 50. The active matrix substrate 50 may further include, for example, a plurality of charge storage capacitors (not shown) respectively connected with the TFTs 10.

As shown in FIG. 1(b), the connection electrode 72 overlaps the semiconductor layer 14 as seen in the direction normal to the active matrix substrate 50. It is preferable that the connection electrode 72 overlaps at least the channel region of the semiconductor layer 14 as seen in the direction normal to the active matrix substrate 50. It is preferable that the connection electrode 72 overlaps the entirety of the semiconductor layer 14 as seen in the direction normal to the active matrix substrate 50. It is preferable that the connection electrode 72 overlaps the entirety of the semiconductor layer 14 as seen in a direction having an angle of 0 to 45 degrees with respect to the direction normal to the active matrix substrate 50.

When the photoelectric conversion substrate 62 is irradiated with radiations, electric charges (hole-electron pairs) as a function of the radiation dose of the radiations are generated. The electric charges are accumulated in a charge storage capacitor (not shown) included in the active matrix substrate 50. The TFT 10 connected with the charge storage capacitor is turned on by a signal supplied to the gate line 12, and thus the electric charges are read out via the source line 16. In this manner, the semiconductor device 100 converts the radiation dose of the radiations directed toward the photoelectric conversion substrate 62 into a charge amount (current amount), and outputs the charge amount as an electric signal or an image.

The photoelectric conversion substrate 62 is formed of, for example, a semiconductor having a photoelectric effect. The photoelectric conversion substrate 62 is formed of, for example, CdTe or CdZnTe. In the case where the photoelectric conversion substrate 62 is thin, the voltage to be applied to the photoelectric conversion substrate 62 may be made small. The semiconductor device 100 is of a direct conversion system of directly converting information on the radiations 101 incident on the semiconductor device 100 into an electric signal. The semiconductor device in an embodiment according to the present invention is not limited to being of this system, and may be of an indirect conversion system like a semiconductor device 110 described below with reference to FIG. 2.

Figure 2:
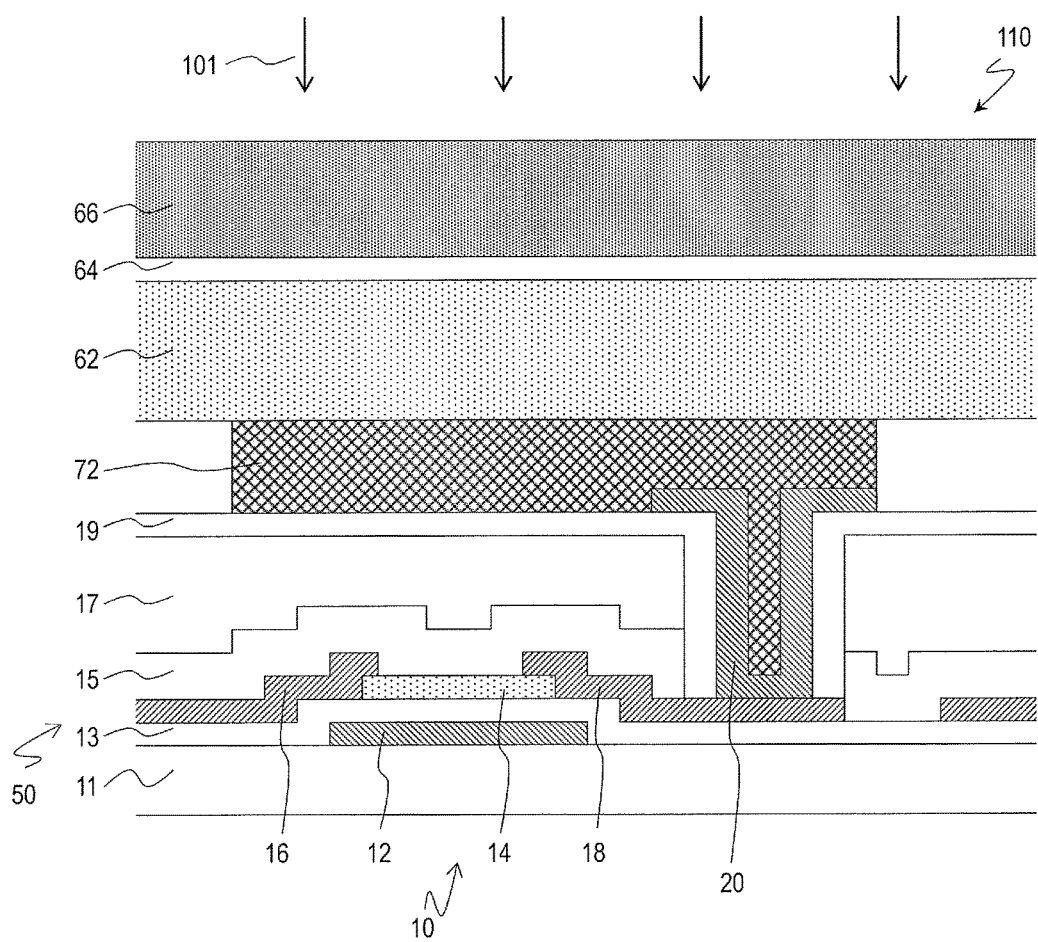
FIG. 2 is a schematic cross-sectional view of another semiconductor device 110 in an embodiment according to the present invention.

With reference to FIG. 2, the semiconductor device 110 in another embodiment according to the present invention will be described. FIG. 2 is a schematic cross-sectional view of the semiconductor device 110.

As shown in FIG. 2, unlike the semiconductor device 100, the semiconductor device 110 is of the indirect conversion system and thus further includes a wavelength conversion layer 66. The semiconductor device 110 may be the same as the semiconductor device 100 except for being of the indirect conversion system. A method for producing the semiconductor device 110 may be the same as a method for producing the semiconductor device 100 described below (see FIG. 4 and FIG. 5) except for the step of forming the wavelength conversion layer 66.

The wavelength conversion layer 66 is provided on the upper electrode 64. The wavelength conversion layer 66 is provided on, for example, the entirety of a top surface of the upper electrode 64. The semiconductor device 110 converts the radiations 101 incident thereon into ultraviolet rays, visible light rays or infrared rays by the wavelength conversion layer 66, and then converts such rays into electric charges by the photoelectric conversion substrate 62. The wavelength conversion layer 66 is typically a scintillator, and the photoelectric conversion substrate 62 is typically a photodiode. The wavelength conversion layer 66 contains, for example, CsI, NaI or the like. The photoelectric conversion substrate 62 is, for example, a PIN-type photodiode or a PN-type photodiode. In the case of being, for example, the PIN-type photodiode, the photoelectric conversion substrate 62 has a multilayer structure including an n-type semiconductor layer, a p-type semiconductor layer, and an i-type semiconductor layer provided between the n-type semiconductor layer and the p-type semiconductor layer. The photoelectric conversion substrate 62 contains, for example, amorphous silicon (a-Si).

In the semiconductor device 110, the connection electrode 72 contains a metal element having an atomic number of 42 or greater and 82 or smaller, and therefore, attenuates the radiations transmitted through the photoelectric conversion substrate 62 among radiations 101 incident on the semiconductor device 110 from the side of the photoelectric conversion substrate 62. The connection electrode 72 overlaps the semiconductor layer 14 of the TFT 10 as seen in the direction normal to the active matrix substrate 50, and therefore, suppresses the radiations transmitted through the photoelectric conversion substrate 62, among the radiations 101 incident on the semiconductor device 110 from the side of the photoelectric conversion substrate 62, from being directly incident on the semiconductor layer 14. Since the radiations transmitted through the photoelectric conversion substrate 62 are suppressed from being directly incident on the semiconductor layer 14, the semiconductor device 110 has a high level of operation stability.

The connection electrode 72 is in direct contact with the pixel electrode 20 and also with the photoelectric conversion substrate 62. Therefore, the semiconductor device 110 does not need to include a connection resin layer that connects the active matrix substrate 50 and the photoelectric conversion substrate 62 to each other. The semiconductor device 110 does not need to include another layer or film in order to improve the operation stability thereof. The semiconductor device 110 realizes a high level of operation stability without decreasing the yield thereof.

Figure 3:
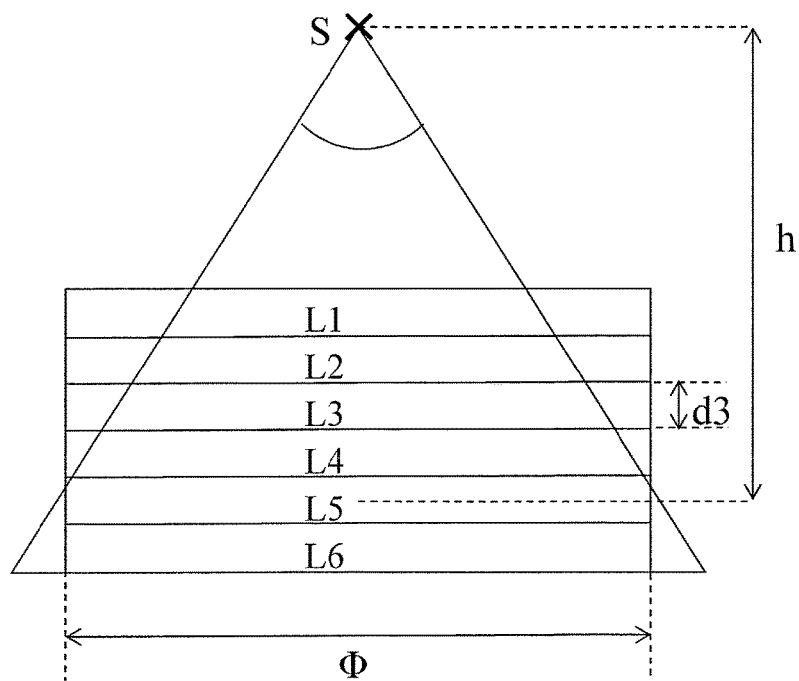
FIG. 3(a) shows a model used for a simulation.
FIG. 3(b) is a graph showing the results of the simulation.
Figure 3:
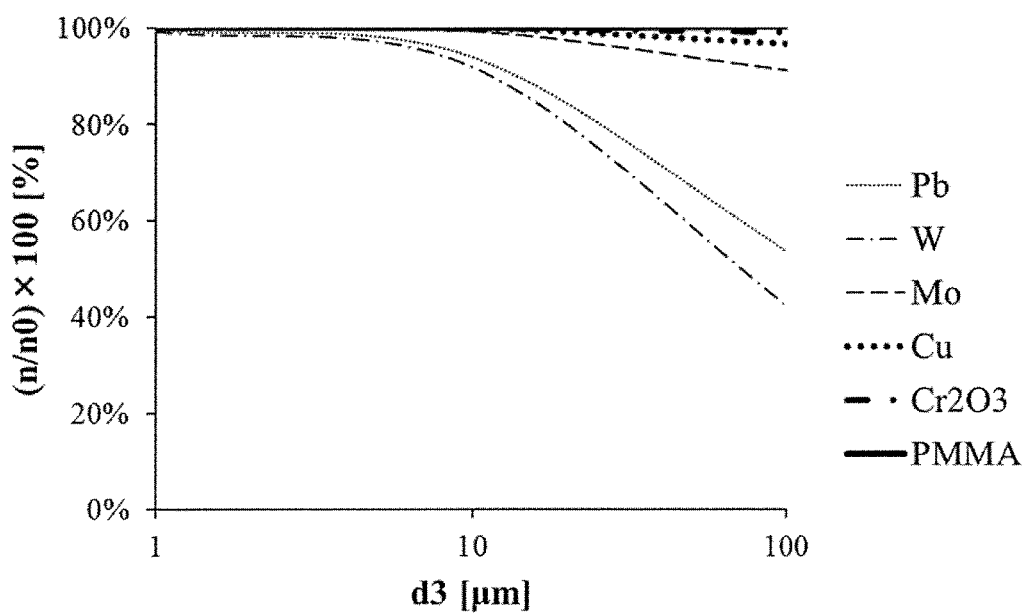

FIG. 3 shows results of a simulation. Hereinafter, attenuation of the radiations incident on the semiconductor layer of the TFT in the semiconductor device in an embodiment according to the present invention will be described.

FIG. 3(a) shows a model (geometry) used for the simulation. In the model shown in FIG. 3(a), x-rays are directed toward a multilayer structure including layers L1 through L6 from a radiation source S provided above the multilayer structure. The simulation was performed on this model. As shown in Table 1 below, the layers L1 through L6 respectively correspond to main layers or films of the semiconductor device 110. Table 1 also shows the substances forming the layers L1 through L6 and the thicknesses of the layers L1 through L6.

TABLE 1

| LAYER | CORRESPONDING LAYER OR FILM | SUBSTANCE | THICKNESS |
|---|---|---|---|
| L1 | WAVELENGTH CONVERSION LAYER 66 | CsI | 500 μm |
| L2 | PHOTOELECTRIC CONVERSION SUBSTRATE 62 | Si | 500 nm |
| L3 | CONNECTION ELECTRODE 72 | | d3 |
| L4 | FIRST INTERLAYER INSULATING FILM 15 | SiN | 300 nm |
| L5 | SEMICONDUCTOR LAYER 14 | InGaZnO$_4$ | 70 nm |
| L6 | GATE INSULATING FILM 13 | SiN | 300 nm |

While the substance forming the layer L3 corresponding to the connection electrode 72 and thickness d3 of layer L3 were changed, the simulation was performed by the Monte Carlo Method to find the number of photons incident on the layer L5 corresponding to the semiconductor layer 14 of the TFT 10 in each of the combinations of the substance and the thickness.

In the model used for the simulation, the layers L1 through L6 are each cylindrical and each have a diameter φ of a bottom surface of 10 cm. The radiation source S is located on a central point of the circular bottom surfaces of the layers L1 through L6 as seen in a direction normal to the bottom surfaces of the layers L1 through L6. Distance h between the radiation source S and the center of the line segment connecting the centers of a top surface and the bottom surface of the layer L5 is 10 cm. From the radiation source S, x-rays having an energy of 100 keV radiates at a solid angle of (π/2)sr (steradian).

FIG. 3(b) and Table 2 below show the results of the simulation regarding the substances forming the layer L3 and the thicknesses d3 of the layer L3. The results of the simulation are each represented by a value obtained by dividing the number n of the photons incident on the layer L5 by the number no of the photons incident on the layer L5 in the case where the layer L3 is replaced with an air layer having an equal thickness to find $n/n_0$ and then multiplying $n/n_0$ by 100 (unit: %).

TABLE 2

| d3 | LEAD | TUNGSTEN | MOLYBDENUM | COPPER | CHROMIUM OXIDE | ACRYLIC RESIN |
|---|---|---|---|---|---|---|
| 1 μm | 100 | 99 | 100 | 100 | 100 | 100 |
| 10 μm | 94 | 92 | 99 | 100 | 100 | 100 |
| 100 μm | 54 | 42 | 91 | 97 | 99 | 100 |

Among the substances forming the layer L3 on which the simulation was performed, lead (Pb), tungsten (W), molybdenum (Mo) and copper (Cu) respectively have atomic numbers of 82, 74, 42 and 29. Chromium oxide ($Cr_2O_3$) and acrylic resin (PMMA; $(CH_2C(CH_3)(COOCH_3))_n$) are used as, for example, a material forming a black matrix in a liquid crystal display device.

As seen from the results shown in Table 2, the layer L3, when being formed of chromium oxide or acrylic resin, has little effect of decreasing the number of photons incident on the layer L5. The layer L3, when being formed of lead, tungsten or molybdenum having an atomic number of 42 or greater and 82 or smaller, has a large effect of decreasing the number of photons incident on the layer L5. Especially in the case where the thickness of the layer L3 is 10 μm or greater, the effect is large. For example, the layer L3, when being formed of tungsten and having a thickness of 100 μm, decreases the number of photons incident on the layer L5 to 42%. For example, according to $|\Delta Vth|=0.1233\ D^{0.8794}$, which is the relational expression, shown in FIG. 9(a), representing the relationship between the absorbed dose D of the radiations directed toward the TFT and the absolute value $|\Delta Vth|$ of the shift in the threshold voltage, the absolute value of the shift in the threshold voltage is decreased from 7.1 V to 3.3 V in the case where the absorbed dose is decreased from 100 Gy to 42 Gy.

The linear absorption coefficient and the linear attenuation coefficient of each of the elements are each in proportion to the density of the element. Therefore, the layer L3, when being formed of any element having an atomic number of 42 or greater and 82 or smaller, provides substantially the same effect as the layer L3, when being formed of lead, tungsten or molybdenum. The substance forming the layer L3 may be a compound (e.g., oxide or nitride) of elements having an atomic number of 42 or greater and 82 or smaller.

It is seen from the results of the simulation described above with reference to FIG. 3 that the semiconductor device 100 and the semiconductor device 110 in the embodiments according to the present invention each suppress, by the connection electrode 72 containing a metal element having an atomic number of 42 or greater and 82 or smaller, the radiations transmitted through the photoelectric conversion layer 62 from being directly incident on the semiconductor layer 14. It is preferable that the thickness of the connection electrode 72 is 10 μm or greater. In the case where the connection electrode 72 has an excessively large thickness, the step of forming the connection electrode 72 is time-consuming and thus the yield may be decreased. Therefore, it is preferable that the thickness of the connection electrode 72 is 100 μm or less.

Figure 4:
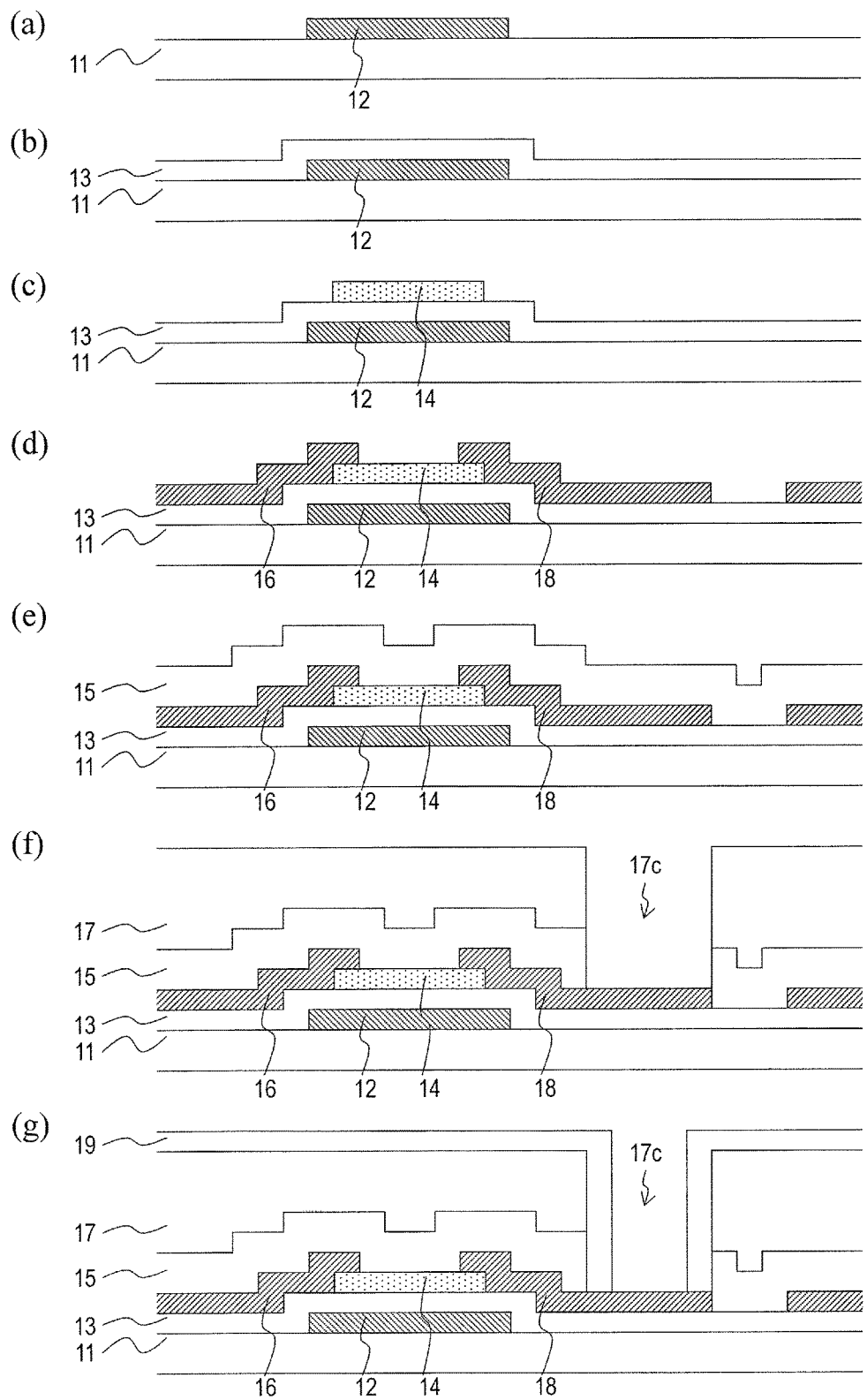
FIG. 4(a) through FIG. 4(g) are each a cross-sectional view showing an example of method for producing the semiconductor device 100.
Figure 5:
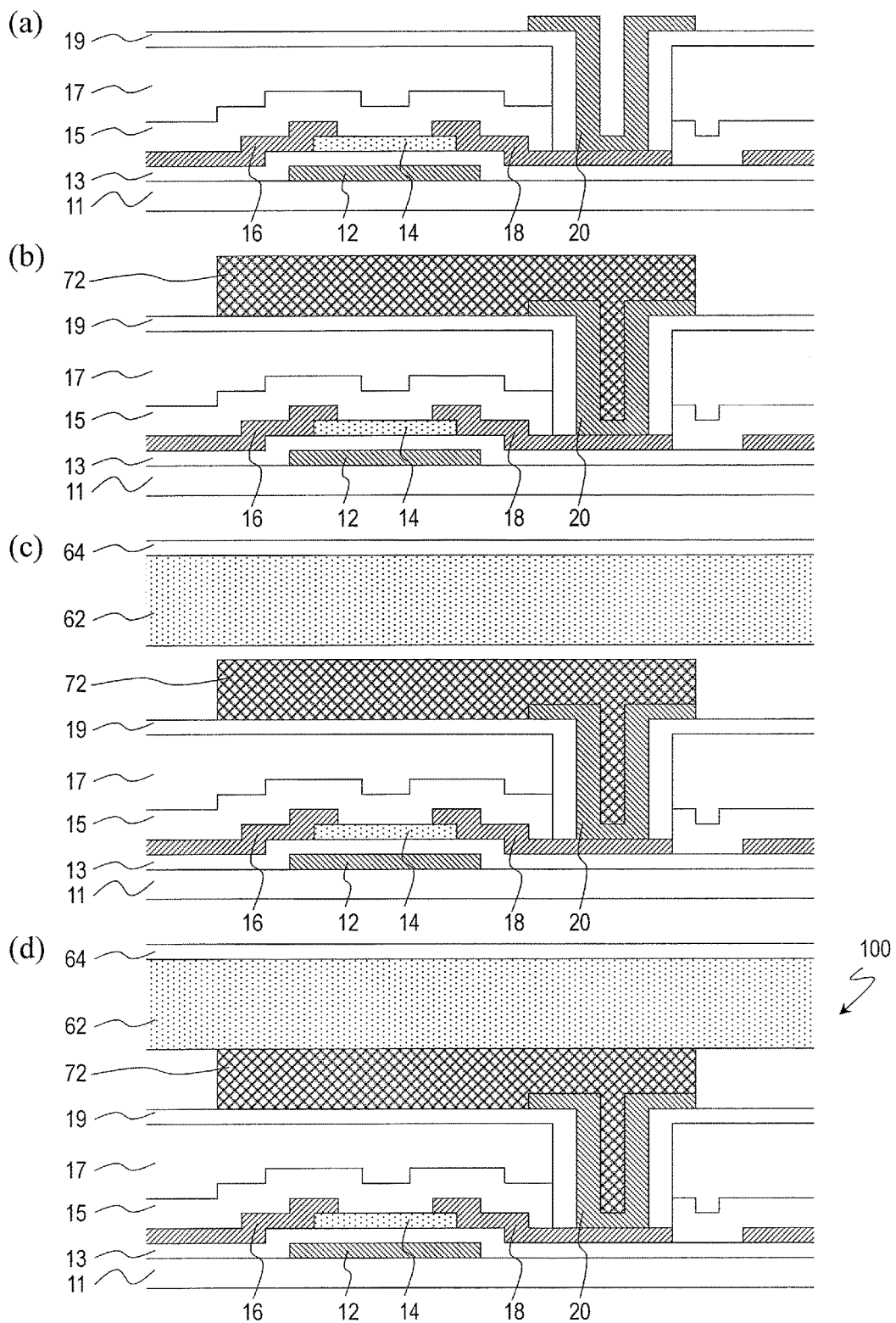
FIG. 5(a) through FIG. 5(d) are each a cross-sectional view showing the example of method for producing the semiconductor device 100.

Now, with reference to FIG. 4 and FIG. 5, a method for producing the semiconductor device 100 will be described. FIG. 4(a) through FIG. 4(g) and FIG. 5(a) through FIG. 5(d) are each a cross-sectional view schematically showing a step of the method for producing the semiconductor device 100.

First, as shown in FIG. 4(a), the gate electrode 12 is formed on the substrate 11.

The gate electrode 12 is formed as follows, for example. A metal material is deposited on the substrate 11 to form a thin film, and then the thin film is patterned by etching in photolithography process.

In the method for producing the semiconductor device 100, the deposition step may be performed by use of, for example, CVD (Chemical Vapor Deposition) or PVD (Physical Vapor Deposition) (e.g., sputtering). The photolithography may be performed by dry etching or wet etching.

The substrate 11 is, for example, a glass substrate or a silicon substrate. Alternatively, the substrate 11 may be formed of a heat-resistive plastic or resin material. The substrate 11 may be formed of, for example, polyethylene terephthalate (PET), polyethylene naphthalate (PEN), polyether sulfone (PES), acrylic resin, or polyimide.

The gate electrode 12 is formed of, for example, a metal material such as aluminum (Al), tungsten (W), molybdenum (Mo), tantalum (Ta), chromium (Cr), titanium (Ti), copper (Cu) or the like. The gate electrode 12 may be formed of an alloy containing such a metal material. The gate electrode 12 may contain a nitride of such a metal material. The gate electrode 12 may be of a single layer or may have a multilayer structure including a plurality of films. The gate electrode 12 has a thickness of, for example, 100 nm to 500 nm.

In this example, the gate electrode 12 has a multilayer structure of, for example, aluminum (Al) and titanium (Ti). The gate electrode 12 has a thickness of, for example, 300 nm. In this example, a conductive film is formed by, for example, sputtering and then is patterned by photolithography by use of a resist mask to form the gate electrode 12.

Next, as shown in FIG. 4(b), the gate insulating film 13 is formed on the gate electrode 12.

The gate insulating film 13 is formed by, for example, depositing an insulating material on the entirety of a top surface of the substrate 11. The gate insulating film 13 contains, for example, silicon dioxide ($SiO_2$), silicon nitride ($SiN_x$), silicon oxide nitride ($SiO_xN_y$; x>y) or silicon nitride oxide ($SiN_xO_y$; x>y). The gate insulating film 13 may be of a single layer or may have a multilayer structure including a plurality of films. The gate insulating film 13 has a thickness of, for example, 100 nm to 500 nm. In this example, the gate insulating film 13 has a multilayer structure of, for example, silicon dioxide and silicon nitride ($SiO_2/SiN_x$). In this example, a silicon nitride film and a silicon dioxide film are sequentially formed by use of, for example, a CVD device to form the gate insulating film 13.

Next, as shown in FIG. 4(c), the semiconductor layer 14 is formed on the gate insulating film 13.

The semiconductor layer 14 is formed as follows, for example. A semiconductor is deposited, and then the resultant semiconductor thin film is patterned by etching in photolithography process. After the semiconductor is deposited but before the photolithography is performed, annealing may be performed when necessary (for example, in the case where the semiconductor contains a semiconductor oxide). The semiconductor layer 14 has a thickness of, for example, 30 nm to 300 nm.

The semiconductor layer 14 contains, for example, a semiconductor oxide. The semiconductor oxide includes, for example, an In—Ga—Zn—O-based semiconductor containing indium, gallium, zinc and oxygen as main components (hereinafter, such a semiconductor will be referred to as an "In—Ga—Zn—O-based semiconductor"). The In—Ga—Zn—O-based semiconductor is a ternary oxide of In (indium), Ga (gallium) and Zn (zinc). There is no specific limitation on the ratio (composition ratio) of In, Ga and Zn. For example, In:Ga:Zn=2:2:1, In:Ga:Zn=1:1:1, In:Ga:Zn=1:1:2, or the like. The semiconductor layer 14 may be formed of an In—Ga—Zn—O-based semiconductor containing In, Ga and Zn at a ratio of In:Ga:Zn=1:1:1.

A TFT including the semiconductor layer of the In—Ga—Zn—O-based semiconductor has a high mobility (more than 20 times as high as that of an a-Si TFT) and a low leak current (less than 1/100 of that of an a-Si TFT), and thus is preferably usable as a driving TFT and a pixel TFT. Use of a TFT including the semiconductor layer of the In—Ga—Zn—O-based semiconductor significantly decreases the power consumption of the semiconductor device and/or improves the resolution of the semiconductor device.

The In—Ga—Zn—O-based semiconductor may be amorphous or may include a crystalline portion. A preferable crystalline In—Ga—Zn—O based semiconductor has a c-axis aligned generally perpendicularly to the layer surface. A crystalline structure of such an In—Ga—Zn—O based semiconductor is disclosed in, for example, Japanese Laid-Open Patent Publication No. 2012-134475. The entirety of the disclosure of Japanese Laid-Open Patent Publication No. 2012-134475 is incorporated herein by reference.

The semiconductor layer 14 may contain another oxide semiconductor instead of the In—Ga—Zn—O-based semiconductor. The semiconductor layer 14 may contain, for example, a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, CdO (cadmium oxide), an Mg—Zn—O-based semiconductor, an In—Sn—Zn—O-based semiconductor (e.g., $In_2O_3$—$SnO_2$—ZnO), an In—Ga—Sn—O-based semiconductor, or the like.

The semiconductor layer 14 may contain another semiconductor instead of the oxide semiconductor. The semiconductor layer 14 may contain, for example, amorphous silicon, polycrystalline silicon, low-temperature polycrystalline silicon, or the like.

In this example, the semiconductor layer 14 is formed of, for example, $InGaZnO_4$.

Next, as shown in FIG. 4(d), the source electrode 16 and the drain electrode 18 are formed.

The source electrode 16 and the drain electrode 18 are formed as follows, for example. A metal material is deposited on the semiconductor layer 14, and then the resultant metal thin film is etched by photolithography to form a predetermined pattern.

The source electrode 16 and the drain electrode 18 are typically formed of the same film as each other. The source electrode 16 and the drain electrode 18 are not limited to being formed of the same film, and may be formed of different films from each other. The source electrode 16 and the drain electrode 18 are each formed of, for example, a metal material such as aluminum (Al), tungsten (W), molybdenum (Mo), tantalum (Ta), chromium (Cr), titanium (Ti), copper (Cu) or the like. The source electrode 16 and the drain electrode 18 may each be formed of an alloy containing such a metal material. The source electrode 16 and the drain electrode 18 may each contain a nitride of such a metal material. The source electrode 16 and the drain electrode 18 may each be of a single layer or may each have a multilayer structure including a plurality of films. The source electrode 16 and the drain electrode 18 each have a thickness of, for example, 100 nm to 500 nm.

In this example, the source electrode 16 and the drain electrode 18 are each formed of a multilayer structure of Ti and Al (Ti/Al/Ti). Ti and Al are sequentially formed by use of a sputtering device and then dry-etched by photolithography into a predetermined pattern to form the source electrode 16 and the drain electrode 18.

Next, as shown in FIG. 4(e), the first interlayer insulating film 15 is formed.

The first interlayer insulating film 15 is formed by depositing an insulating material over the entirety of the top surface of the substrate 11. After the deposition, annealing may be performed when necessary.

The first interlayer insulating film 15 contains, for example, silicon nitride, silicon dioxide, silicon nitride oxide or silicon oxide nitride. The first interlayer insulating film 15 may be of a single layer or may have a multilayer structure including a plurality of films. The first interlayer insulating film 15 has a thickness of, for example, 100 nm to 500 nm. In this example, the first interlayer insulating film 15 has a multilayer structure of, for example, silicon dioxide and silicon nitride ($SiO_2/SiN_x$).

Next, as shown in FIG. 4(f), the interlayer flattening film 17 is formed, and a contact hole 17c is formed.

An insulating material is applied to the first interlayer insulating film 15, and then is etched by photolithography to form the contact hole 17c. The contact hole 17c is formed in order to form the pixel electrode 20. The contact hole 17c runs through the first interlayer insulating film 15 and the interlayer flattening film 17 to expose a part of a surface of the drain electrode 18.

The interlayer flattening film 17 is formed of, for example, an inorganic insulating material (e.g., silicon dioxide, silicon nitride, silicon oxide nitride, or silicon nitride oxide) or an organic insulating material. The interlayer flattening film 17 has a thickness of, for example, 100 nm to 300 nm. In this example, the interlayer flattening film 17 is formed of, for example, silicon nitride or the like.

Next, as shown in FIG. 4(g), the second interlayer insulating film 19 is formed.

An insulating material is deposited on the interlayer flattening film 17, and then is etched by photolithography to expose a part of the surface of the drain electrode 18. The second interlayer insulating film 19 is formed of, for example, the same material as that of the first interlayer insulating film 15.

Next, as shown in FIG. 5(a), the pixel electrode 20 is formed.

The pixel electrode 20 is formed as follows, for example. A metal material or an inorganic conductive material is deposited over the substrate 11 to form a thin film, and the thin film is patterned by etching in photolithography process.

The pixel electrode 20 contains, for example, a metal material or an inorganic conductive material (e.g., oxide or nitride). The metal material that may be contained in the pixel electrode 20 is, for example, molybdenum (Mo) or the like. The inorganic conductive material that may be contained in the pixel electrode 20 is, for example, an In—Zn—O-based semiconductor (IZO (registered trademark)) or the like. The pixel electrode 20 has a thickness of, for example, 100 nm to 300 nm.

Next, as shown in FIG. 5(b), the connection electrode 72 is formed.

The connection electrode 72 is formed as follows. A metal material is deposited and then patterned by etching in photolithography process. This step results in the formation of the connection electrode 72 on, in direct contact with, the pixel electrode 20.

The active matrix substrate 50 is produced by the steps described above with reference to FIG. 4(a) through FIG. 4(g) and FIG. 5(a) through FIG. 5(b). Separately from the steps for producing the active matrix substrate 50, the photoelectric conversion substrate 62 is prepared, and the upper electrode 64 is formed on one surface of the photoelectric conversion substrate 62.

The photoelectric conversion substrate 62 has a thickness of, for example, 100 nm to 1000 nm. The upper electrode 64 is formed by, for example, depositing a metal material or an inorganic conductive material on the surface of the photoelectric conversion substrate 62. The upper electrode 64 contains, for example, indium tin oxide (ITO), indium zinc oxide (IZO (registered trademark)) or the like. The upper electrode 64 has a thickness of, for example, 100 nm to 300 nm.

Either the steps for forming the active matrix substrate 50, or the steps for preparing the photoelectric conversion substrate 62 and forming the upper electrode 64, may be performed first.

After the steps for forming the active matrix substrate and the steps for preparing the photoelectric conversion substrate 62 and forming the upper electrode 64, the active matrix substrate 50 and the photoelectric conversion substrate 62 are located to face each other and positioned with respect to each other as shown in FIG. 5(c).

Next, as shown in FIG. 5(d), the active matrix substrate and the photoelectric conversion substrate 62 are bonded together. As a result of the bonding, the connection electrode 72 and the photoelectric conversion substrate 62 are secured as being in direct contact with each other. For the bonding, for example, an adhesive containing a resin is usable. For the bonding, for example, a known sealing material that is used for a liquid crystal display device is usable.

The semiconductor device 100 is produced by the above-described steps.

Figure 6:
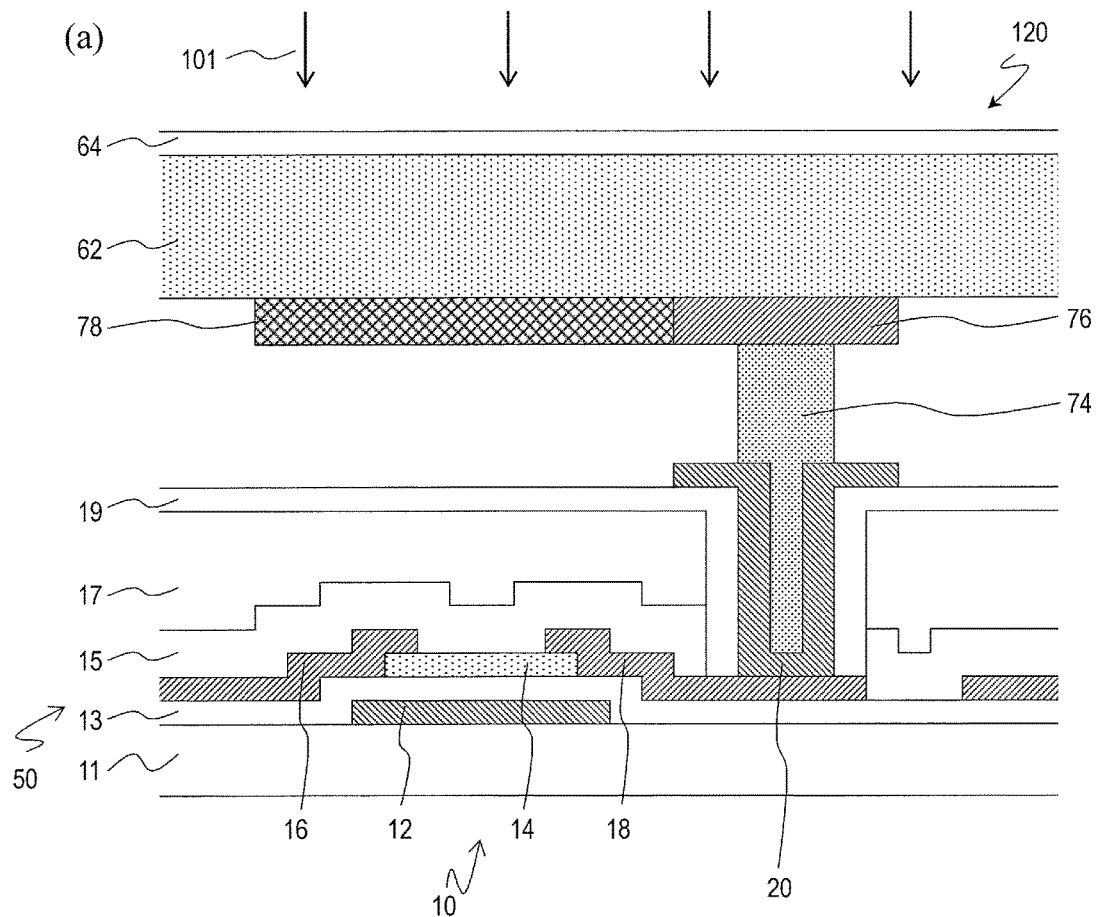
FIG. 6(a) is a schematic cross-sectional view of still another semiconductor device 120 in an embodiment according to the present invention.
FIG. 6(b) is a schematic plan view of the semiconductor device 120.
Figure 6:
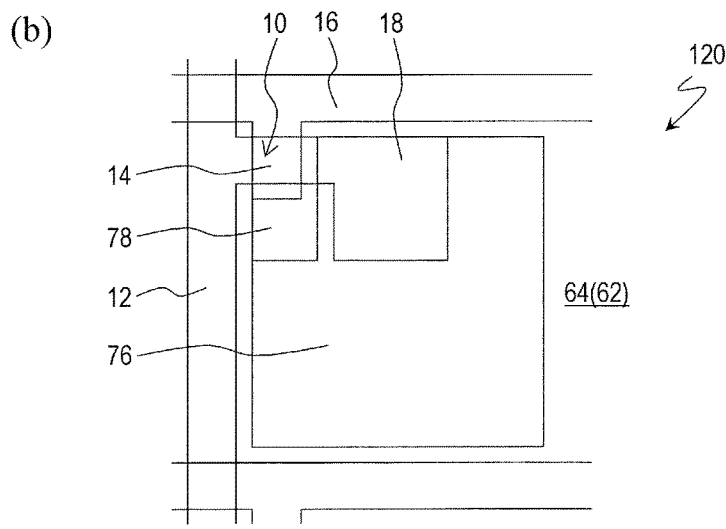

Now, with reference to FIG. 6, still another semiconductor device 120 in an embodiment according to the present invention will be described. FIG. 6(a) is a schematic cross-sectional view of the semiconductor device 120, and FIG. 6(b) is a schematic plan view of the semiconductor device 120.

As shown in FIG. 6(a), unlike the semiconductor device 100, the semiconductor device 120 includes a plurality of connection electrodes 76, a plurality of radiation absorption films 78 and a connection resin layer 74 provided between the active matrix substrate 50 and the photoelectric conversion substrate 62. The semiconductor device 120 may be the same as the semiconductor device 100 except for the above-described points.

The plurality of connection electrodes 76 and the plurality of radiation absorption films 78 are formed on a surface of the photoelectric conversion substrate 62 that faces the active matrix substrate 50. The connection resin layer 74 is provided between the pixel electrodes 20 and the connection electrodes 76 and includes a plurality of connection resin portions 74. For the sake of simplicity, the connection resin portions 74 are represented by the same reference sign as that of the connection resin layer 74. The connection resin portions 74 each electrically connect a corresponding pixel electrode 20 and a corresponding connection electrode 76 to each other. The radiation absorption films 78 are insulating.

The radiation absorption films 78 each overlap the semiconductor layer 14 of the corresponding TFT 10 as seen in the direction normal to the active matrix substrate 50. The radiation absorption film 78 contains an element having an atomic number of 42 or greater and 82 or smaller. The radiation absorption film 78 may contain a single element having an atomic number of 42 or greater and 82 or smaller or a compound (e.g., oxide or nitride) of such elements. The semiconductor device 120 may include a plurality of the connection resin layers.

In the semiconductor device 120, the radiation absorption film 78 contains an element having an atomic number of 42 or greater and 82 or smaller, and therefore, attenuates radiations transmitted through the photoelectric conversion substrate 62 among the radiations 101 incident on the semiconductor device 120 from the side of the photoelectric conversion substrate 62. The radiation absorption film 78 overlaps the semiconductor layer 14 of the TFT 10 as seen in the direction normal to the active matrix substrate 50, and therefore, suppresses the radiations transmitted through the photoelectric conversion substrate 62, among the radiations 101 incident on the semiconductor device 120 from the side of the photoelectric conversion substrate 62, from being directly incident on the semiconductor layer 14. Since the radiations transmitted through the photoelectric conversion substrate 62 are suppressed from being directly incident on the semiconductor layer 14, the semiconductor device 120 has a high level of operation stability.

In the semiconductor device 120, the radiation absorption film 78 is insulating. Therefore, the connection electrode 76 and the radiation absorption film 78 do not need to be provided so as not to be in direct contact with each other in the steps of being formed on the surface of the photoelectric conversion substrate 62. The semiconductor device 120 realizes a high level of operation stability without decreasing the yield thereof. The radiation absorption film 78 may be in direct contact with the connection electrode 76.

As shown in FIG. 6(b), the radiation absorption film 78 overlaps the semiconductor layer 14 as seen in the direction normal to the active matrix substrate 50. It is preferable that the radiation absorption film 78 overlaps at least the channel region of the semiconductor layer 14 as seen in the direction normal to the active matrix substrate 50. It is preferable that the radiation absorption film 78 overlaps the entirety of the semiconductor layer 14 as seen in the direction normal to the active matrix substrate 50. It is preferable that the radiation absorption film 78 overlaps the entirety of the semiconductor layer 14 as seen in a direction having an angle of 0 to 45 degrees with respect to the direction normal to the active matrix substrate 50. The surface of the photoelectric conversion substrate 62 that faces the active matrix substrate 50 may be covered with the plurality of connection electrodes 76 and the plurality of radiation absorption films 78.

Figure 7:
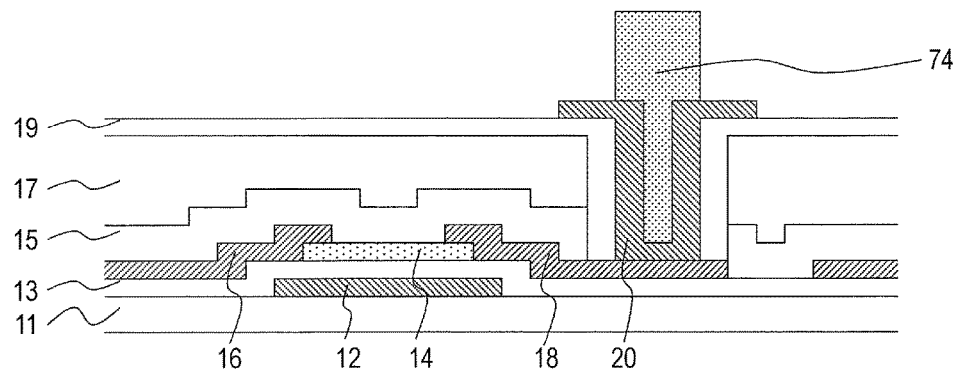
FIG. 7(a) through FIG. 7(c) are each a cross-sectional view showing an example of method for producing the semiconductor device 120.
Figure 7:
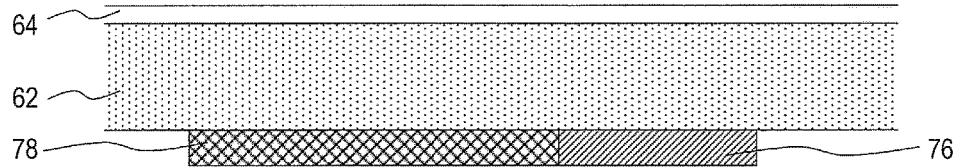
Figure 7:
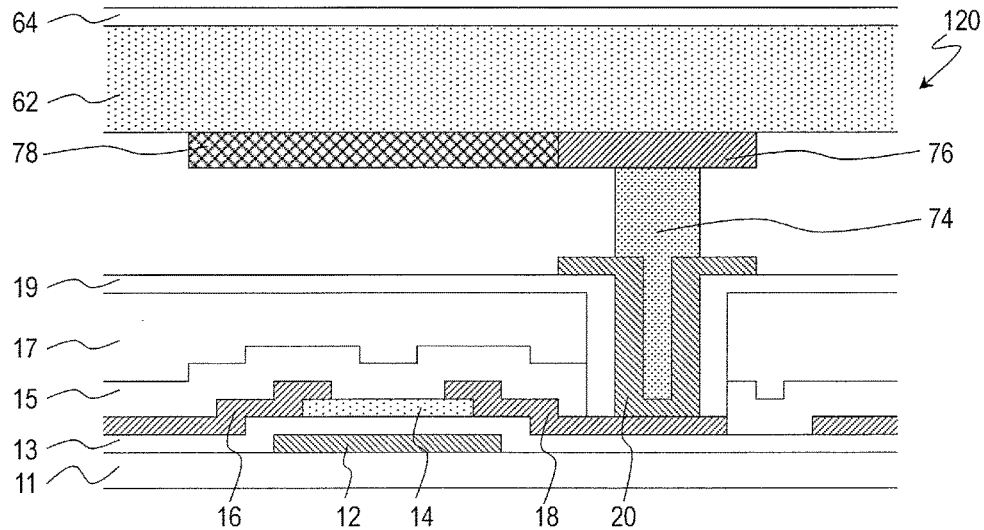

Now, with reference to FIG. 7, a method for producing the semiconductor device 120 will be described. FIG. 7(a) through FIG. 7(c) are each a cross-sectional view schematically showing a step of the method for producing the semiconductor device 120. The steps that are the same as those described above regarding the method for producing the semiconductor device 100 will not be described.

First, among the steps of the method for producing the semiconductor device 100, the steps described above with reference to FIG. 4(a) through FIG. 4(g) and FIG. 5(a) are performed also for producing the semiconductor device 120 in substantially the same manner.

Next, as shown in FIG. 7(a), the connection resin layer 74 is formed on the pixel electrode 20. The connection resin layer 74 is formed as follows. A material for the connection resin layer 74 is applied over the entirety of the top surface of the active matrix substrate 50 and etched by photolithography into a pattern of the connection resin layer 74. The material for the connection resin layer 74 may be applied by a screen printing method or an inkjet method to form a predetermined pattern of the connection resin layer 74.

The connection resin layer 74 contains a resin (e.g., acrylic resin, epoxy resin, etc.) and is conductive. The connection resin layer 74 is, for example, an anisotropic conductive paste formed of a resin containing conductive particles dispersed therein. The conductive particles may be, for example, metal particles, metal-plated particles, carbon particles or the like.

Separately from the steps for producing the active matrix substrate 50, the photoelectric conversion substrate 62 is prepared, and the upper electrode 64 is formed on one surface of the photoelectric conversion substrate 62. On another surface of the photoelectric conversion substrate 62, the connection electrode 76 and the radiation absorption film 78 are formed.

The connection electrode 76 is formed as follows. A material for the connection electrode 76 (e.g., metal material or inorganic conductive material) is deposited on the surface of the photoelectric conversion substrate 62 to form a thin film, and the thin film is patterned by etching in photolithography process. The radiation absorption film 78 is formed as follows, for example. After the connection electrode 76 is formed, an insulating material is deposited on the surface of the photoelectric conversion substrate 62 to form a thin film (by, for example, sputtering), and then the thin film is patterned by etching in photolithography process.

Either the steps for forming the active matrix substrate 50, or the steps for preparing the photoelectric conversion substrate 62 and forming the upper electrode 64, the connection electrode 76 and the radiation absorption film 78, may be performed first.

Next, as shown in FIG. 7(b), the active matrix substrate 50 and the photoelectric conversion substrate 62 are located to face each other and positioned with respect to each other.

Next, as shown in FIG. 7(c), the active matrix substrate and the photoelectric conversion substrate 62 are bonded together. As a result of the bonding, the pixel electrode 20 and the connection electrode 76 are electrically connected with each other by the connection resin portion 74.

The semiconductor device 120 is produced by the above-described steps.

Figure 8:
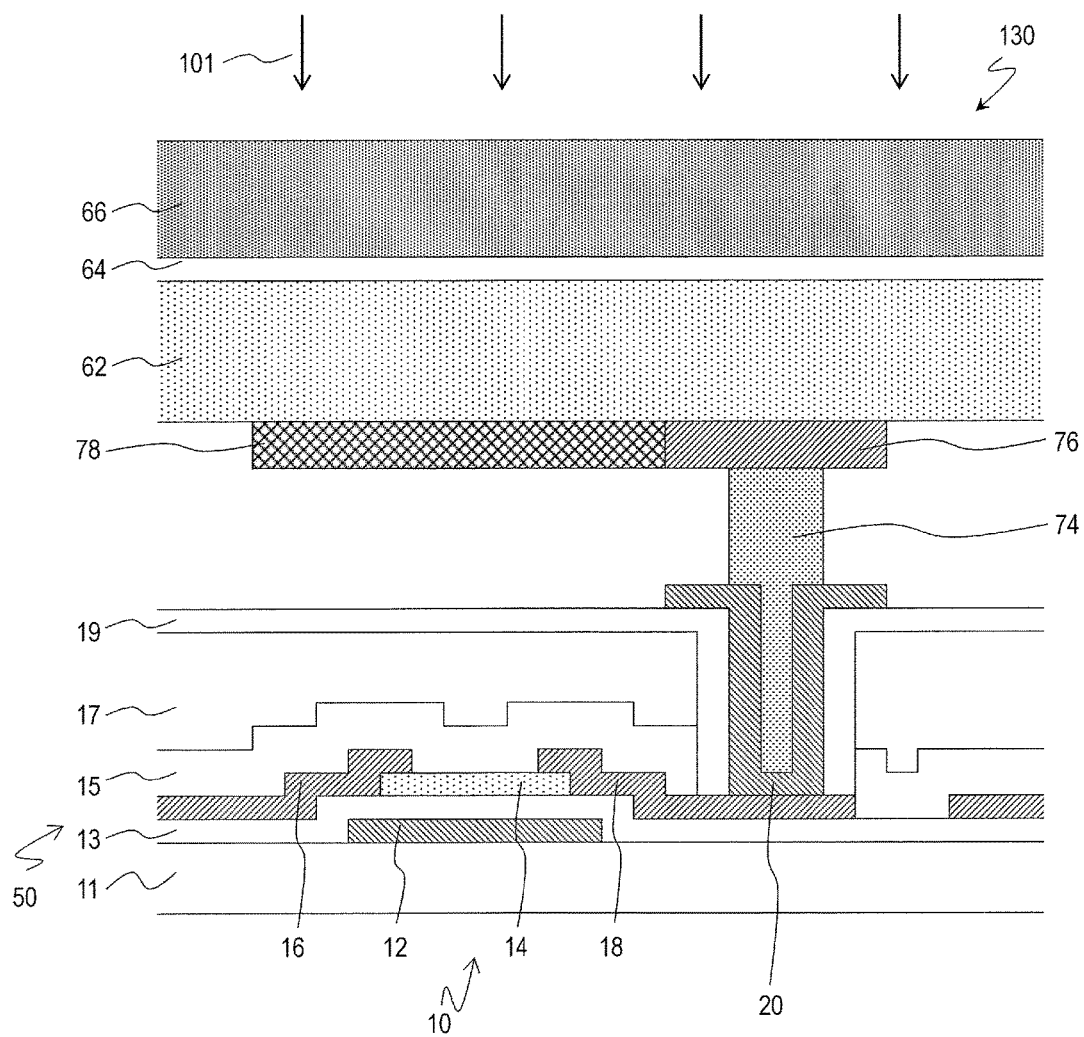
FIG. 8 is a schematic cross-sectional view of still another semiconductor device 130 in an embodiment according to the present invention.

Now, with reference to FIG. 8, still another semiconductor device 130 in an embodiment according to the present invention will be described. FIG. 8 is a schematic cross-sectional view of the semiconductor device 130.

As shown in FIG. 8, the semiconductor device 130 is of the indirect conversion system and further includes the wavelength conversion layer 66, unlike the semiconductor device 120. The semiconductor device 130 may be the same as the semiconductor device 120 except for being of the indirect conversion system. The wavelength conversion layer 66 of the semiconductor device 130 may be the same as, for example, the wavelength conversion layer 66 of the semiconductor device 110. A method for producing the semiconductor device 130 may be the same as the method for producing the semiconductor device 120 except for the step of forming the wavelength conversion layer 66.

In the semiconductor device 130, the radiation absorption film 78 contains an element having an atomic number of 42 or greater and 82 or smaller, and therefore, attenuates radiations transmitted through the photoelectric conversion substrate 62 among the radiations 101 incident on the semiconductor device 130 from the side of the photoelectric conversion substrate 62. The radiation absorption film 78 overlaps the semiconductor layer 14 of the TFT 10 as seen in the direction normal to the active matrix substrate 50, and therefore, suppresses the radiations transmitted through the photoelectric conversion substrate 62, among the radiations 101 incident on the semiconductor device 130 from the side of the photoelectric conversion substrate 62, from being directly incident on the semiconductor layer 14. Since the radiations transmitted through the photoelectric conversion substrate 62 are suppressed from being directly incident on the semiconductor layer 14, the semiconductor device 130 has a high level of operation stability.

In the semiconductor device 130, the radiation absorption film 78 is insulating. Therefore, the connection electrode 76 and the radiation absorption film 78 do not need to be provided so as not to be in direct contact with each other in the steps of being formed on the surface of the photoelectric conversion substrate 62. The semiconductor device 130 realizes a high level of operation stability without decreasing the yield thereof.

INDUSTRIAL APPLICABILITY

A semiconductor device in an embodiment according to the present invention is usable as any of various radiation detection devices or light detection devices such as, for example, a flat panel-type x-ray detection device, an image sensor or the like. A semiconductor device in an embodiment according to the present invention is also usable for, for example, non-destructive inspection such as hand baggage check or the like in the airport or the like, as well as in a medical field.

REFERENCE SIGNS LIST

10 TFT
11 Substrate
12 Gate electrode (gate line)
14 Semiconductor layer
16 Source electrode (source line)
18 Drain electrode
20 Pixel electrode
50 Active matrix substrate
62 Photoelectric conversion substrate
64 Upper electrode
66 Wavelength conversion layer
72, 76 Connection electrode
74 Connection resin layer (connection resin portion)
78 Radiation absorption film
100, 110, 120, 130 Semiconductor device
101 Radiations

The invention claimed is:

1. A semiconductor device, comprising:
an active matrix substrate including a plurality of thin-film transistors (TFTs) and a plurality of pixel electrodes;
a photoelectric conversion substrate located to face the active matrix substrate;
an upper electrode provided on a surface of the photoelectric conversion substrate opposite to the active matrix substrate;
a plurality of connection electrodes and a plurality of radiation absorption films provided on a surface of the photoelectric conversion substrate that faces the active matrix substrate; and
at least one connection resin layer provided between the plurality of pixel electrodes and the plurality of connection electrodes, the at least one connection resin layer including a plurality of connection resin portions each electrically connecting any of the plurality of pixel electrodes and any of the plurality of connection electrodes to each other; wherein
each of the plurality of radiation absorption films is insulating, overlaps a semiconductor layer of any of the plurality of TFTs as viewed in a direction normal to the active matrix substrate, and contains an element having an atomic number of 42 or greater and 82 or smaller, and
none of the plurality of radiation absorption films is in contact with the plurality of pixel electrodes.

2. The semiconductor device according to claim 1, wherein the plurality of radiation absorption films are each in direct contact with any of the plurality of connection electrodes.

3. The semiconductor device according to claim 1, wherein the surface of the photoelectric conversion substrate that faces the active matrix substrate is covered with the plurality of connection electrodes and the plurality of radiation absorption films.

4. The semiconductor device according to claim 1, wherein the plurality of radiation absorption films each have a thickness of 10 μm or greater and 100 μm or less.

5. A method for producing a semiconductor device, comprising:
step (a) of preparing an active matrix substrate including a plurality of TFTs and a plurality of pixel electrodes and providing a plurality of connection resin portions on the plurality of pixel electrodes, the plurality of connection resin portions each being connected to any of the plurality of pixel electrodes;
step (b) of preparing a photoelectric conversion substrate, providing an upper electrode on one surface of the photoelectric conversion substrate, and forming a plurality of connection electrodes and a plurality of radiation absorption films on another surface of the photoelectric conversion substrate, the plurality of radiation absorption films each being insulating and containing an element having an atomic number greater than or equal to 42 and less than or equal to 82; and
step (c) of bonding the active matrix substrate and the photoelectric conversion substrate together in a state that each of the plurality of connection resin portions is connected to any of the plurality of connection electrodes and the plurality of radiation absorption films are located to face the active matrix substrate via a gap after the steps (a) and (b).

6. The semiconductor device according to claim 1, wherein the photoelectric conversion substrate converts radiations into electric charges.

7. The semiconductor device according to claim 1, further comprising a wavelength conversion layer converting radiations into at least one of infrared rays, visible light rays and ultraviolet rays;
wherein the photoelectric conversion substrate converts the at least one of the infrared rays, the visible light rays and the ultraviolet rays into electric charges.

8. The semiconductor device according to claim 1, wherein the semiconductor layer contains an oxide semiconductor.

9. The semiconductor device according to claim 8, wherein the oxide semiconductor includes an In—Ga—Zn—O-based semiconductor.

10. The semiconductor device according to claim 9, wherein the In—Ga—Zn—O-based semiconductor includes a crystalline portion.

11. The semiconductor device according to claim 1, wherein none of the plurality of radiation absorption films overlaps the plurality of pixel electrodes as viewed in the direction normal to the active matrix substrate.

12. The semiconductor device according to claim 1, wherein the plurality of radiation absorption films are located to face the active matrix substrate via a gap.

* * * * *